United States Patent [19]

Kullander et al.

[11] 4,399,168

[45] Aug. 16, 1983

[54] METHOD OF PREPARING COATED CEMENTED CARBIDE PRODUCT

[75] Inventors: Gregor H. Kullander, Älvsjö; Christopher G. Chatfield, Stockholm; Marian Mikuš, Skärholmen; Bo K. Westergren, Hägersten, all of Sweden

[73] Assignee: Santrade Ltd., Lucerne, Switzerland

[21] Appl. No.: 278,473

[22] Filed: Jun. 29, 1981

Related U.S. Application Data

[63] Continuation of Ser. No. 113,751, Jan. 21, 1980, abandoned.

[51] Int. Cl.$^3$ .................... C23C 11/00; C23C 13/00
[52] U.S. Cl. .................... 427/255.7; 148/31.5;
427/248.1; 427/249; 427/252; 427/255;
427/255.2; 427/343; 427/377; 427/419.1;
427/419.2; 427/419.7; 428/698; 428/701;
428/702
[58] Field of Search ............ 427/248.1, 255.2, 255.3,
427/255.4, 255.7, 255, 252, 249, 379, 380, 377,
343, 419.2, 419.3, 419.7, 271, 273, 335, 336, 337;
428/622, 627, 938, 539, 472, 469, 698, 701, 702;
148/31.5, 16.6, 16.5, 6.3; 29/575; 252/79.2

[56] References Cited

U.S. PATENT DOCUMENTS

| | | | |
|---|---|---|---|
| 3,640,689 | 2/1972 | Glaski et al. | 427/249 |
| 3,656,995 | 4/1972 | Reedy | 427/255.4 |
| 3,736,107 | 5/1973 | Hale | 428/332 |
| 3,836,392 | 9/1974 | Lux et al. | 148/6.3 |
| 3,836,410 | 9/1974 | DuBois | 252/79.2 |
| 3,837,896 | 9/1974 | Lindstrom et al. | 428/336 |
| 3,914,473 | 10/1975 | Hale | 427/255 |
| 3,923,567 | 12/1975 | Lawrence | 29/575 |
| 3,955,038 | 5/1976 | Lindstrom et al. | 427/249 |
| 3,964,937 | 6/1976 | Post et al. | 427/255.7 |
| 4,018,631 | 4/1977 | Hale | 427/377 |
| 4,035,541 | 7/1977 | Smith et al. | 427/249 |
| 4,101,703 | 7/1978 | Schintlmeister | 428/539 |
| 4,162,338 | 7/1979 | Schintlmeister | 427/255.7 |

FOREIGN PATENT DOCUMENTS

| | | |
|---|---|---|
| 1042711 | 9/1966 | United Kingdom . |
| 1115908 | 6/1968 | United Kingdom . |
| 1118362 | 7/1968 | United Kingdom . |

*Primary Examiner*—Sadie L. Childs
*Attorney, Agent, or Firm*—Burns, Doane, Swecker & Mathis

[57] ABSTRACT

An improved process for the production of coated cemented carbide products is disclosed. A cemented carbide substrate is treated to form a metal carbide, nitride or carbonitride coating. The coated substrate is heat treated at a temperature close to or near the melting point of the binder metal of the cemented carbide to diffuse elements from the substrate into the coating. An intermediate (second) metal carbide, nitride or carbonitride coating is thereafter applied and the portion of the second is oxidized, nitrided or sulfided without detrimentally affecting the adherence of the second coating. Thereafter, a wear-resistant oxide (e.g., aluminum oxide) coating is applied to form the improved coated carbide product.

2 Claims, No Drawings

METHOD OF PREPARING COATED CEMENTED CARBIDE PRODUCT

This is a continuation of application Ser. No. 113,751, filed Jan. 21, 1980, abandoned.

The present invention relates to cemented carbide bodies having at least one thin, extremely wear resistant surface layer and to a method of making such products. More particularly, it relates to such coated cemented carbide products in which a layer of aluminum oxide or other wear resistant oxide is firmly bonded to the substrate.

It heretofore was known that an improved wear resistance can be obtained in hard metal (cemented carbide) bodies, for example, cutting inserts, by applying a surface layer of wear resistant oxide upon a substrate of conventional sintered hard metal containing at least one carbide together with a binder metal (see, for example, U.S. Pat. Nos. 3,736,107 and 3,836,392). Usually, the thin layer has been applied by deposition from a gaseous phase (e.g., Chemical Vapor Deposition or "CVD" technique), but several other methods have been proposed.

Disturbances from the substrate (and from the material in the reactor vessel, etc.) may obstruct the formation of layers having a satisfactory structure (morphology) and binding ability to the substrate if an oxide layer is applied directly upon the hard metal. Therefore, further development steps have been performed in order to give the products improved properties, suited for the commercial market.

It heretofore was known that desired results could be obtained by the utilization in such composites of different kinds of intermediate layers, for example, one or more layers of carbides, carbonitrides and/or nitrides of Ti, Zr, Hf, V, Nb, Ta, Cr, Mo, W, Si and/or B (see, for example, U.S. Pat. No. 3,837,896). In said patent, belonging to the same assignee as the present application, it was noted that neither of the layers contains a binder metal. Other known cemented carbide products consist of laminated layers of different hard metal grades. Such other known cemented carbide products were prepared by conventional pressing and sintering techniques and contained therefore considerable amounts of binder metal (see, for example, British Pat. Nos. 1,042,711, 1,115,908 and 1,118,362). Thus, the statement in U.S. Pat. No. 3,837,896 that the coatings should be free frm binder metal was not meant to exclude certain inclusions or small contents of mainly Co and W or WC that can be present in the intermediate layer. The essential feature of the invention of U.S. Pat. No. 3,837,896 is that the intermediate layer serves as a barrier to "catch" the mentioned elements, etc., and prevent their diffusion through the layer so that harmful influences upon the oxide layer from these constituents of the substrate can be avoided at the sites of nucleation and/or the growth of the oxide layer. By these means, a coherent and continuous carbide or nitride layer free from binder metal can be obtained at least in a zone immediately below the oxide layer.

It was also known that improved adherence of oxide coatings on cemented carbide substrates could be obtained by a method comprising certain heat treatment and oxidizing steps (see, for example, U.S. Pat. No. 4,018,631). In this method there was a combination of essentially four different steps (I)–(IV):

(I) Forming on the cemented carbide substrate (containing W and Co) a coating comprising a material selected from carbide, nitride, carbonitride and mixtures thereof of metal selected from Ti, Ta, Hf, Zr, Nb and mixtures thereof.

(II) Diffusing W and Co into said coating by heating the product at a temperature greater than the melting point of the Co phase.

(III) Oxidizing said coating.

(IV) Applying an oxide layer.

All these steps were known, either separately or in certain combinations, in connection with coatings on cemented carbide. Thus, the commercial product covered by the earlier mentioned U.S. Pat. No. 3,837,896 is a combination of the steps (I) and (IV). Furthermore, there is mentioned in the specification of said U.S. Patent (see, for example, Column 3, lines 52–57) that also the step (III) may be utilized. Finally, the heat treatment of coated cemented carbide at an increased temperature, i.e., step (II), was disclosed in the earlier mentioned U.S. Pat. No. 3,836,392 (see, for example, Column 2, lines 38–45). The said U.S. Pat. No. 3,836,392 was in turn indirectly referred to in the specification, Column 1, lines 25–47, of U.S. Pat. No. 3,837,896, both patents now belonging to the same assignee.

It has now been found that new and improved results can be obtained by a certain modification of some of these known steps and utilization of these steps in conjunction with other treating steps. It has now also been found, quite surprisingly, that further, considerable improvements in use and adherence can be achieved if the above-mentioned complete oxidizing of the heat treated coating is avoided.

The advantages which might be expected from the earlier mentioned known process which includes oxidation of the surface of the coated cemented carbide, would at first sight appear to be a result of the formation of a compound on that surface which is related to the wear resistant oxide applied afterwards. It has been found, however, that the oxidation of the intermediate layer, for example, in the case of a titanium carbide coating, from TiC to TiO, $TiO_2$ or other oxide or oxycarbide (realizing that corresponding compounds containing nitrogen can also be formed if nitrogen is present) causes an expansion of the volume of the layer which can give rise to cracks in the layer. In addition, difficulties arise in the bonding of oxides containing titanium to oxides containing aluminum. There are, however, different ways of avoiding the effects of the above-mentioned oxidizing step while making the substrate surface more receptive to the wear resistant oxide coating thereafter applied, as will be described hereinafter, and by these means it is possible to obtain further advantages in the final product.

In accordance with the present invention there is provided a method of treating a cemented carbide substrate containing at least one carbide together with binder metal in order to improve its wear resistance and utility, which method consists essentially of treating the substrate in an atmosphere selected from carbide, nitride and carbonitride forming atmospheres to form or apply a coating essentially comprising at least one coat of at least one member selected from the group consisting of carbides, nitrides and carbonitrides of the elements Ti, Zr, Hf, Nb, Ta, Cr, Mo, W, Si and B; heat treating the coated substrate at a temperature close to or greater than the melting point of the binder phase in order to diffuse elements from the substrate into said coating and from the substrate into the coating; treating the thus-obtained substrate in an atmosphere selected from carbide, nitride and carbonitride forming atmospheres to form or apply a second coating essentially comprising at least one member selected from the group consisting of carbides, nitrides and carbonitrides of the element Ti, Zr, Hr, V, Nb, Ta, Cr, Mo, W, Si and B; treating the resulting substrate with an oxygen-, nitrogen- or sulfur-containing gas to oxidize, nitride or sulfide a portion of the second coating without detrimentally affecting the adherence of the second coating to the said substrate; and applying a wear resistant oxide coating on the thus-pretreated cemented carbide substrate.

The present invention of treating a cemented carbide substrate containing at least one carbide together with binder metal (generally tungsten carbide and cobalt together with other carbides or metals belonging to the groups IVB, VB and VIB of the periodic system if desired as well as possibly other alloying elements) is thus characterized in that as a first step (a) the substrate is treated in a gaseous atmosphere selected from carbide, nitride and carbonitride forming atmospheres in order to form or apply a surface coating essentially comprising a material selected from carbide, nitride, carbonitride and mixtures thereof of elements selected from Ti, Zr, Hf, V, Nb, Ta, Cr, Mo, W, Si and B. After that, in a second step (b) the product, i.e., the substrate provided with a coating according to (a), is heat-treated at a temperature close to or exceeding the melting point of a binder metal phase. Then, in a third step (c), the treatment of step (a) is repeated to provide a second coating. The resulting substrate is then contacted with an atmosphere containing an oxygen, nitrogen- or sulfur-containing gas to oxide, nitride and/or sulfide a portion of the second coating (without oxidizing, etc., the whole of the second coating which causes the said coating to have poor adherence). Thereafter, a wear resistant oxide layer is applied on the substrate.

The first step (a), by which surface coatings of carbide, nitride or carbonitride (preferably titanium carbide, titanium nitride) are formed or applied, can be performed in several different ways. Besides a usual method which is deposition from a gaseous phase containing metal halide, hydrogen, hydrocarbon and possibly nitrogen (CVD technique), a layer can be applied by pack-cementing and/or resintering. In the last instance, the metal or the hard element (for example TiC) is taken from the substrate. This latter instance is equivalent to the treatment of the substrate according to the steps (a)+(b) as one operation in which the metal or metals forming the actual carbide, nitride and/or carbonitride are diffused from the interior of the substance to the surface where they are being enriched by using a reactive gas. In this case, the cemented carbide in the substrate has to contain at least some $\gamma$(gamma)-phase carbide, i.e., it has to contain at least some of the carbide in the form of a cubic carbide such as TiC, TaC, NbC, etc. Thus, there is obtained a $\chi$(gamma)-phase zone at the surface of the substrate and the application of a surface layer (according to the step (a)) and the recrystallization and growth of the grains of the layer (being obtained in the process according to the step (b)) can be substituted by a single process step. Because of said grain growth which is normally obtained, the amount of grain boundaries in the surface layer is reduced and the diffusion of metals as W and Co from the substrate is impeded to a great extent as this diffusion takes place essentially along the grain boundaries.

It has also been found that a surface having a great micro-roughness can be obtained in the last mentioned treatment because of the grain growth and/or the recrystallization, which means an enlarged area of contact and possibilities of "hook-binding" or otherwise adhering the following oxide layer applied according to the step (c) to the substrate.

A method of enriching titanium carbide to the surface of cemented carbide containing $\gamma$(gamma)-phase by packing processes at sintering temperature was, however, known per se (see, for example, U.S. Pat. No. 3,564,683, Example 5, in which packing of cemented carbide in $TiO_2$ and graphite at 1350° C. is described). Also other similar processes were known (see, for example, British patent specification No. 1,506,915) in which a surface layer of carbide was obtained on a cemented carbide body by treatment of the body with carbon monoxide. By said treatment, the concentration or carbide was caused to be greater in the surface layer than within the remainder of the body.

Also the heat treatment, according to step (b) which is generally conducted in a non-reactive atmosphere such as vacuum, argon, hydrogen and the like at a temperature above the melting point of the matrix binder metal (in the case of cobalt, a temperature of from about 1200° to 1600° C.) for a time sufficient to diffuse the metal from the substrate to the coating (usually from about 5 minutes up to about 3 hours or longer) can preferably be performed at a high temperature within that range such that a certain conversion of the crystals in the coating of carbide, etc., is obtained. This increased temperature of diffusion will cause a formation of a micro-rough surface offering the same possibilities and advantages as mentioned in the foregoing.

The surface coating of carbide, etc., according to step (a) can be applied under such circumstances and at such a supersaturation that short whiskers, ellipsoidal plates or coarse grains of the carbide, etc., are formed. Suitable conditions for formation of whiskers can be obtained at a carefully adjusted, relatively low supersaturation. ("Supersaturation" or over-saturation is present when the beginning concentrations of reactants and products, ordered as in an equilibrium equation, are smaller than the equilibrium concentrations ordered in an analogous way). (See for example "Proceedings of the Conference on Chem. Vap. Dep. of Refr. Metals, Alloys and Compounds" (1967) USA, page 3.)

In order to clean the hard metal bodies or if a certain amount of the binder metal such as cobalt, or if a tungsten phase has penetrated to the outermost part of the surface layer during the heat treatment, an etching operation can be efficiently utilized. By etching as for example with HCl, possibly in a gaseous phase (in $H_2$), the binder metal is removed. Furthermore, the etching can be effective in the formation of a micro-rough surface. Tungsten and/or tungsten carbide can be removed in a similar way by selective etchants. By the concurrent addition of $H_2$ to the etching gas there is also obtained a reduction of cobalt oxide and tungsten oxide which may possibly be present and whose formation can cause cracking.

After application of the first layer and the subsequent or simultaneous diffusion step, a very thin second layer of carbide, nitride and/or carbonitride of the earlier mentioned elements is applied, preferably by CVD-techniques, upon said substrate. The second layer can, if desired, be of the same material as applied in the step (a) and the treatment is of special interest if this layer and/or the layer according to the step (a) has been applied at conditions which produce short whiskers, ellipsoidal plates or coarse grains at the surface which results in an enlarged area of bonding between the carbide, nitride and/or carbonitride and the following oxide layer. The whiskers should not be so long, however, that the surface of the subsequent oxide layer will be too rough.

When a sufficiently effective bond has been obtained between the substrate heated according to the steps (a)+(b) and the very thin layer of carbide, nitride and/or carbonitride, for example, between an (inner) TiC-enriched zone of the substrate and a second, outer TiC coating, the substrate is contacted with an oxygen-, nitrogen- or sulfur-containing gas to partially oxidize, nitride or sulfide the outer (or second layer). It has been found that if all of the second layer is oxidized, for example, its adherence to the underlying substrate is poor and the layer may fall off in normal usage. It is therefore important the treatment of the composite be conducted such that the entirety of the second layer is not oxidized, nitrided or sulfided. Although the reasons for the improved results obtained when only a portion (that is, less than about 70% of the thickness of this surface is oxidized, etc.) it appears that the treatment of step (b) changes the relatively fine-grained surface of the first layer into a relatively coarse-grained surface. It also appears that the fine-grained surface gives a more complete, continuous oxide layer (as compared to the coarse-grained surface).

The treatment of the substrate with an oxygen-, nitrogen- or sulfur-containing gas may be conducted in accordance with conventional techniques. For example, if the treatment of the substrate to provide the second layer is performed in a gaseous phase by CVD-technique, a gas containing one or more of oxygen, nitrogen or sulfur or their compounds can be added at the end of or at a period during the coating process and in this way cause said elements to be taken up in the layer in a natural order and without the type of problems obtained when separate layers are applied in succeeding, discrete steps. For example, this structure can be obtained without the kind of cracking found when the layer is oxidized by $CO_2+H_2$ after the coating as proposed in U.S. Pat. No. 4,018,613. The addition of the mentioned elements to the intermediate layer causes an improved adherence to the outer oxide layer.

In particular, very interesting and beneficial results are obtained when the treatment to form the first layer is performed without using any chlorine or chlorine compounds in the gaseous phase.

The oxide, nitride and/or sulfide partial outer layer may also be applied by oxidizing, nitriding and/or sulfiding the substrate by conventional techniques known in the art, e.g., utilizing mixtures of $CO_2$ (or CO)+$H_2$. This method is especially efficient when especially good protection is sought to prevent cobalt diffusion from the substrate.

Instead of using $CO_2+H_2$, to oxidize the outer layer it is also possible to treat the coating with a mixture containing sulfur, e.g., $CS_2+H_2$, which forms a sulfide on the outer layer or a mixture containing nitrogen, e.g., a nitrogen oxide and $H_2$, which forms a nitride on the outer layer.

In addition, the last-mentioned oxidizing, nitriding and/or sulfiding treatment may be applied to the substrate treated as mentioned above in which an oxygen-, nitrogen- or sulfur-containing gas is added to the CVD depositing gas of the second layer.

Optionally, another thin coating of carbide, nitride and/or carbonitride can be deposited on top of the last mentioned coating prior to the last alumina coating step and, if desired, an oxygen- or sulfur-containing gas may be added to the CVD depositing gas in the same manner as described above.

It is also advantageous to apply by a further step a wear resistant aluminum oxide layer, suitably a relatively thin layer by means of CVD-technique at a temperature around 1000° C. By this step there is obtained a bonding of oxide during the critical CVD nucleation stage, which is particularly desirable in regard to adherence. A CVD-layer (not heat treated) is also more wear resistant than a heat treated CVD layer.

In certain instances, extra strong adherence between the substrate and a coating can be obtained by heat-treating the product after applying the second layer (before and/or after it is oxidized, nitrided or sulfided) in a further step at a temperature close to or exceeding the melting point of the binder metal phase in the same manner as set forth above for step (b). If desired, the substrate, after application of the aluminum oxide coating may also be heat-treated in a similar manner.

It may also be advantageous to apply to the aluminum oxide-coated substrate another layer of a carbide, nitride or carbonitride as described above in regard to the first step and thereafter applying another aluminum oxide wear resistant layer in the same manner described above.

The invention is additionally illustrated in connection with the following Examples which are to be considered as illustrative of the present invention. It should be understood, however, that the invention is not limited to the specific details of the Examples.

EXAMPLE 1

100 cemented carbide cutting inserts (type SPUN 120308) are coated with a thin layer of TiC in a conventional CVD pilot plant. The composition of the cemented carbide is in % by weight: 86% WC, 5.5% Co and the remainder cubic carbides (TaC, NbC and TiC). The deposition process is performed at 1030° C. and 20 Torr; the deposition time is 4 hours. The gas contains 4% $CH_4$ and 4% $TiCl_4$, the remainder being essentially $H_2$. There is obtained a coating of TiC with a thickness of 2 μm.

The coated inserts are then heat-treated at 1350° C. to 1500° C. in a tunnel furnace in hydrogen atmosphere for a time in the heat zone of from about 1 to 3 hours (the shorter times being used for the inserts treated at the higher temperatures).

The cutting inserts are then coated with successive layers of (TiC+TiN) and TiC under process conditions including a gas composition of 4% $CH_4$, 4% $TiCl_4$, remainder $H_2$ applied as before. After that, the gas composition is changed to 10% $TiCl_4$, 30% $N_2$ and 60% $H_2$ and a thin layer of TiN is applied on the TiC-coated bodies. The total thickness of the (TiC+TiN) and TiC layers was about 0.5-2 μm.

Prior to the final $Al_2O_3$ coating, however, the top TiC coating—being 0.5 μm thick is surface oxidized by a $CO_2$ and $H_2$ mixture (8% $CO_2$) by which a 0.2 μm thick oxidized layer is formed. The remainder of the 0.5 μm TiC layer remains unoxidized. The resulting product shows excellent adherence of the oxide coating in comparison tests.

EXAMPLE 2

100 cemented carbide inserts are treated in accordance with Example 1. Prior to the final $Al_2O_3$ coating, however, another TiC-coating is added on top of this oxidized coating. This coating is obtained in accordance with the first deposition step of Example 1 and its thickness is ½ μm. The resulting product shows superior life in comparison cutting tests.

EXAMPLE 3

A batch of 100 cemented carbide inserts is treated in accordance with Example 1. However, instead of the $CO_2+H_2$ mixture used for surface oxidation, a mixture of CO (1%), $TiCl_4$ (0.5%) balance $H_2$ is used. A 0.2 μm thick Ti(C,O) layer is obtained immediately below the aluminum oxide coating. The adherence of $Al_2O_3$ coating is improved.

EXAMPLE 4

A batch of 100 cemented carbide inserts is treated in accordance with Example 3. Prior to the final $Al_2O_3$ coating, another TiC-coating is added on top of the oxidized coating in accordance with the first deposition step of Example 1 and its thickness is about ½ μm. The resulting product shows superior life in comparison cutting tests.

EXAMPLE 5

Two batches of 100 cemented carbide inserts are treated in accordance with Examples 1 and 2, respectively. Prior to the final $Al_2O_3$ deposition, a TiC coating designed to yield coarse grains is added. The added TiC coating is formed by coating with CVD-technique as in the first deposition step of Example 1 with a relatively short (about 1 hour) coating time. During the last 20 minutes of the deposition time, 1% propane and 2.5% HCl are added to obtain a coarse grain size in the surface of the coating. Improved adherence of the coating is achieved.

EXAMPLE 6

A batch of inserts treated in accordance with Examples 1 and 2 is treated with HCl prior to the final $Al_2O_3$ coating. It is found that as a result of the heat treatments utilized in these processes of Examples 1 and 2, some of the cutting inserts show an enrichment of the binder metal (e.g., cobalt) on the surface of the inserts where the cobalt has diffused from the interior of the substrate. As the presence of the cobalt will negatively affect the adherence to the surface layer of the later applied oxide coating, most of the cobalt present in the surface zone is efficiently removed by etching the inserts with an $H_2+HCl$ mixture containing 0.1 to 10% HCl. It is found that the substrate (including the TiC layer) becomes more rough and irregular because of this treatment. This irregular surface gives an improved adherence of the oxide layer.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. Method of treating a cemented carbide substrate containing at least one carbide together with binder metal in order to improve its wear resistance and utility, which method consists essentially of the sequential steps of:
    (a) treating the substrate in an atmosphere selected from carbide, nitride and carbonitride forming atmospheres to form or apply a coating essentially comprising at least one coat of at least one member selected from the group consisting of carbides, nitrides and carbonitrides of the elements Ti, Zr, Hf, V, Nb, Ta, Cr, Mo, W, Si and B;
    (b) heat treating the coated substrate at a temperature close to or greater than the melting point of the binder phase in order to diffuse elements away from the substrate into said coating and from the coating into the substrate and to form a microrough surface on the substrate;
    (c) treating the substrate from step (b) in an atmosphere selected from carbide, nitride and carbonitride forming atmospheres to form or apply a second coating essentially comprising at least one member selected from the group consisting of carbides, nitrides and carbonitrides of the elements Ti, Zr, Hf, V, Nb, Ta, Cr, Mo, W, Si and B;
    (d) treating the resulting substrate with a nitrogen-containing gas to nitride a portion of the second coating without detrimentally effecting the adherence of the second coating to the said substrate; and
    (e) applying a wear resistant oxide coating on the thus pretreated cemented carbide substrate.

2. Method of treating a cemented carbide substrate containing at least one carbide together with binder metal in order to improve its wear resistance and utility, which method consists essentially of the sequential steps of:
    (a) treating the substrate in an atmosphere selected from carbide, nitride and carbonitride forming atmospheres to form or apply a coating essentially comprising at least one coat of at least one member selected from the group consisting of carbides, nitrides and carbonitrides of the elements Ti, Zr, Hf, V, Nb, Ta, Cr, Mo, W, Si and B;
    (b) heat treating the coated substrate at a temperature close to or greater than the melting point of the binder phase in order to diffuse elements from the substrate into said coating and from the coating into the substrate and to form a microrough surface on the substrate, the treatment of the substrate according to steps (a) and (b) above being performed as one operation, in which the member of the metals of the substrate forming the carbide, nitride and carbonitride is brought to diffuse from the interior of the substrate out to the surface;
    (c) treating the substrate from step (b) in an atmosphere selected from carbide, nitride and carbonitride forming atmospheres to form or apply a second coating essentially comprising at least one member selected from the group consisting of carbides, nitrides and carbonitrides of the elements Ti, Zr, Hf, V, Nb, Ta, Cr, Mo, W, Si and B;
    (d) treating the resulting substrate with a nitrogen-containing gas to nitride a portion of the second coating without detrimentally effecting the adherence of the second coating to the said substrate; and
    (e) applying a wear resistant oxide coating on the thus pretreated cemented carbide substrate.

* * * * *